United States Patent
Kang et al.

(10) Patent No.: US 10,134,838 B2
(45) Date of Patent: Nov. 20, 2018

(54) SEMICONDUCTOR DEVICE

(71) Applicant: SAMSUNG ELECTRONICS CO., LTD., Suwon-si, Gyeonggi-do (KR)

(72) Inventors: Myoung-Ho Kang, Suwon-si (KR); Jung-Ho Do, Hwaseong-si (KR); Giyoung Yang, Seoul (KR); Seungyoung Lee, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/820,053

(22) Filed: Nov. 21, 2017

(65) Prior Publication Data
US 2018/0182846 A1 Jun. 28, 2018

(30) Foreign Application Priority Data
Dec. 22, 2016 (KR) .................. 10-2016-0177028

(51) Int. Cl.
| H01L 29/06 | (2006.01) |
| H01L 27/092 | (2006.01) |
| H01L 29/08 | (2006.01) |
| H01L 21/8238 | (2006.01) |
| H01L 29/78 | (2006.01) |

(52) U.S. Cl.
CPC .. H01L 29/0653 (2013.01); H01L 21/823814 (2013.01); H01L 21/823821 (2013.01); H01L 21/823878 (2013.01); H01L 27/0924 (2013.01); H01L 29/0847 (2013.01); H01L 29/7848 (2013.01)

(58) Field of Classification Search
CPC ..... H01L 21/823814; H01L 21/823821; H01L 21/823878; H01L 27/0924; H01L 29/0653; H01L 29/0847; H01L 29/7848
See application file for complete search history.

(56) References Cited

U.S. PATENT DOCUMENTS

| 8,394,680 | B2 | 3/2013 | Lee |
| 8,394,681 | B2 | 3/2013 | Parikh |
| 8,661,393 | B2 | 2/2014 | Boone et al. |
| 9,431,383 | B2 * | 8/2016 | Baek .............. H01L 29/785 |
| 9,734,276 | B2 * | 8/2017 | Kim ............... G06F 17/5072 |
| 2014/0048889 | A1 | 2/2014 | Bitterlich |
| 2015/0161314 | A1 | 6/2015 | Kim |
| 2015/0205901 | A1 | 7/2015 | Kim et al. |
| 2016/0027769 | A1 | 1/2016 | Baek et al. |
| 2016/0099248 | A1 | 4/2016 | Wu |
| 2016/0117431 | A1 | 4/2016 | Kim et al. |

* cited by examiner

Primary Examiner — Andrew Q Tran
(74) Attorney, Agent, or Firm — F. Chau & Associates, LLC

(57) ABSTRACT

A semiconductor device includes a substrate that includes active patterns extending in a second direction, a third device isolation layer disposed on an upper portion of the substrate that includes a PMOSFET region and an NMOSFET region, and a gate electrode that extends across the active patterns in a first direction that crosses the second direction. The active patterns extend across the PMOSFET region and the NMOSFET region. The third device isolation layer lies between the PMOSFET region and the NMOSFET region. The third device isolation layer comprises a first part that extends in the second direction and a second part that extends in a third direction that crosses the first and second directions. The second part has opposite sidewalls parallel to the third direction, in a plan view.

20 Claims, 16 Drawing Sheets

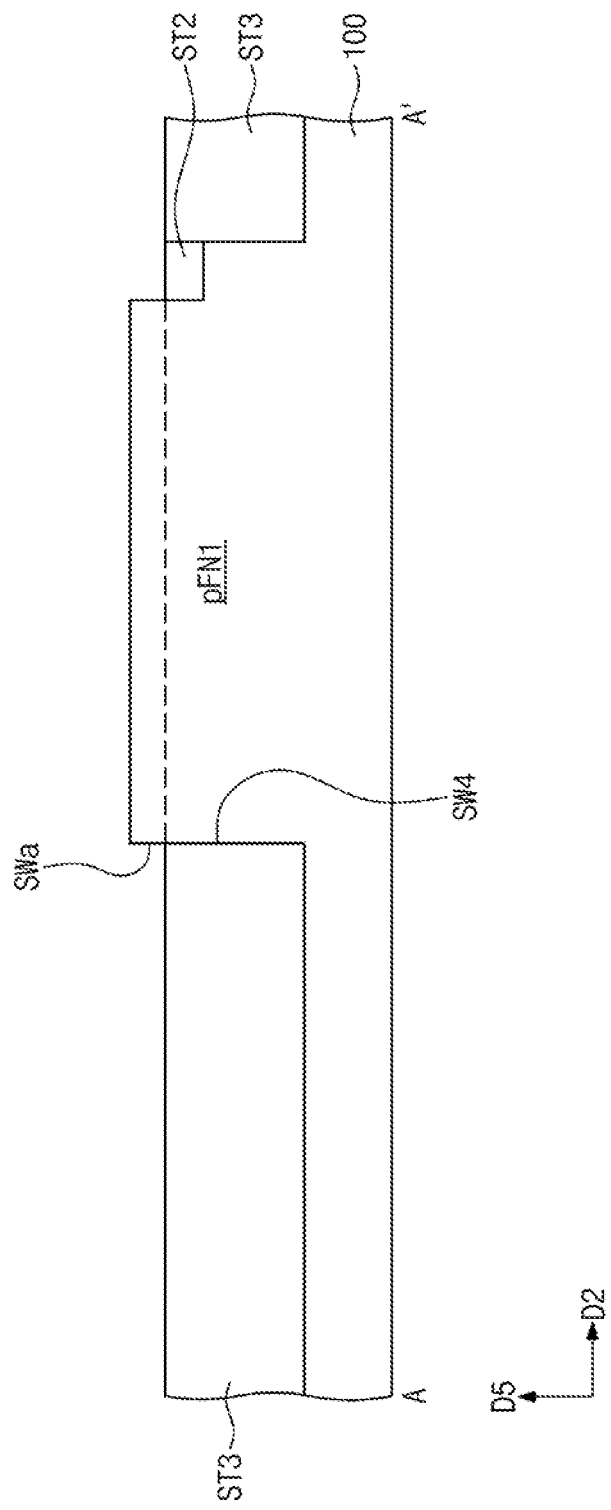

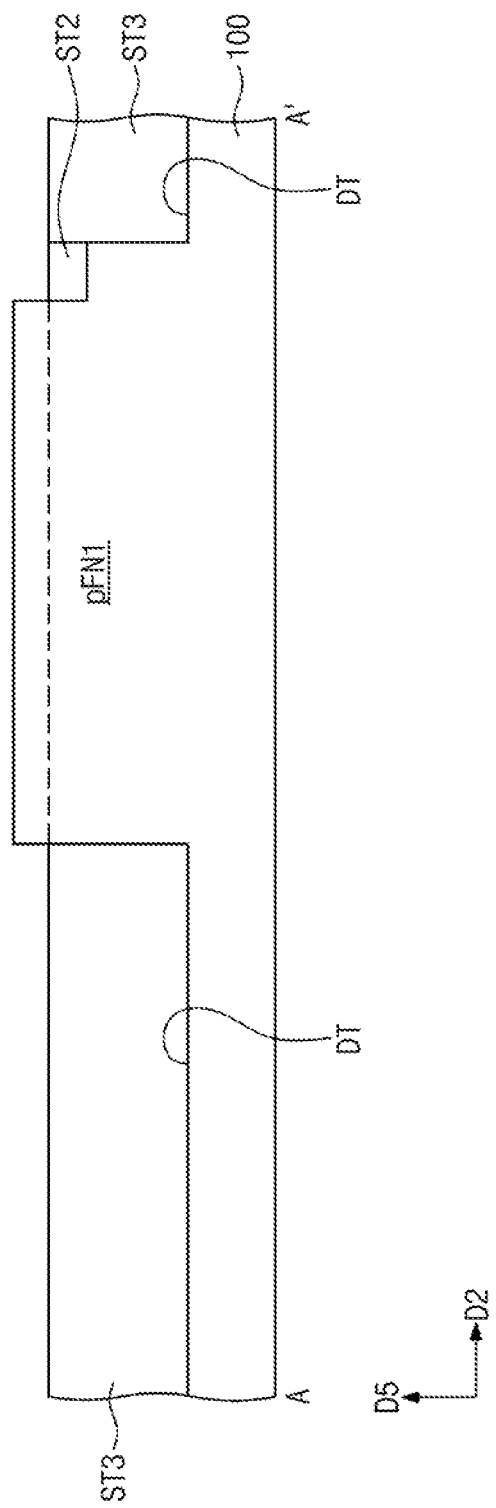

SEMICONDUCTOR DEVICE

CROSS-REFERENCE TO RELATED APPLICATIONS

This U.S. nonprovisional patent application claims priority under 35 U.S.C. § 119 from, and the benefit of, Korean Patent Application No. 10-2016-0177028, filed on Dec. 22, 2016 in the Korean Intellectual Property Office, the contents of which are herein incorporated by reference in their entirety.

BACKGROUND

Embodiments of the present inventive concept are directed to a semiconductor device, and more particularly, to a semiconductor device that includes a field effect transistor.

Semiconductor devices are important in the electronics industry because of their small size, multi-function capabilities, and low fabrication costs. The semiconductor device may be categorized as any one of a semiconductor memory device storing logic data, a semiconductor logic device processing operations of logic data, and a hybrid semiconductor device having both memory and logic elements. Semiconductor devices are increasingly required for high integration due to advanced developments in the electronics industry. For example, semiconductor devices are increasingly used for high reliability, high speed, and multifunction capabilities. Semiconductor devices have become gradually more complicated and highly integrated to satisfy these characteristics.

SUMMARY

Embodiments of the present inventive concept can provide a semiconductor device that includes a field effect transistor having enhanced electrical characteristics.

According to exemplary embodiments of the present inventive concept, a semiconductor device comprises: a substrate that includes active patterns that extend in a second direction; a third device isolation layer on an upper portion of the substrate that includes a PMOSFET region and an NMOSFET region; and a gate electrode that extends across the active patterns in a first direction that crosses the second direction. The active patterns extend across the PMOSFET region and the NMOSFET region. The third device isolation layer is disposed between the PMOSFET region and the NMOSFET region. The third device isolation layer comprises: a first part that extends in the second direction; and a second part that extends in a third direction that crosses the first and second directions. The second part has opposite sidewalls parallel to the third direction, in a plan view.

According to exemplary embodiments of the present inventive concept, a semiconductor device comprises: a substrate that includes an active pattern that extends in a second direction; and first device isolation layers and a third device isolation layer disposed on an upper portion of the substrate. The active pattern includes first to fourth sidewalls. The second sidewall is opposite to the first sidewall. The fourth sidewall is opposite to the third sidewall. The first device isolation layers cover the first and second sidewalls of the active pattern. The third device isolation layer covers the third sidewall of the active pattern. The first and second sidewalls are parallel to the second direction, in a plan view. The fourth sidewall is parallel to a first direction that crosses the second direction, in a plan view. The third sidewall is parallel to a third direction that crosses the first and second directions, in a plan view. The third device isolation is deeper than the first device isolation layers.

According to exemplary embodiments of the present inventive concept, a semiconductor device comprises: a substrate that includes active patterns that extend in a second direction; first device isolation layers disposed on an upper portion of the substrate that extend in the second direction, wherein the first device isolation layers define the active patterns; a second device isolation layer disposed on the upper portion of the substrate that separates the active patterns from each other in the second direction, wherein the second device isolation layer extends in a first direction that crosses the second direction; and a third device isolation layer disposed on the upper portion of the substrate. The third device isolation layer comprises: a first part that extends in the second direction; a second part that extends in a third direction that crosses the first and second directions, where the second part has opposite sidewalls parallel to the third direction, in a plan view, and a third part that extends in the second direction, where the second part is interposed between the first and third parts.

BRIEF DESCRIPTION OF THE DRAWINGS

FIGS. 2A to 2C are cross-sectional views respectively taken along lines A-A', B-B', and C-C' of FIG. 1.

FIGS. 8A, 10A, and 12A are cross-sectional views that correspond to line A-A' of FIGS. 7, 9, and 11, respectively.

DETAILED DESCRIPTION OF EMBODIMENTS

Figure 1:
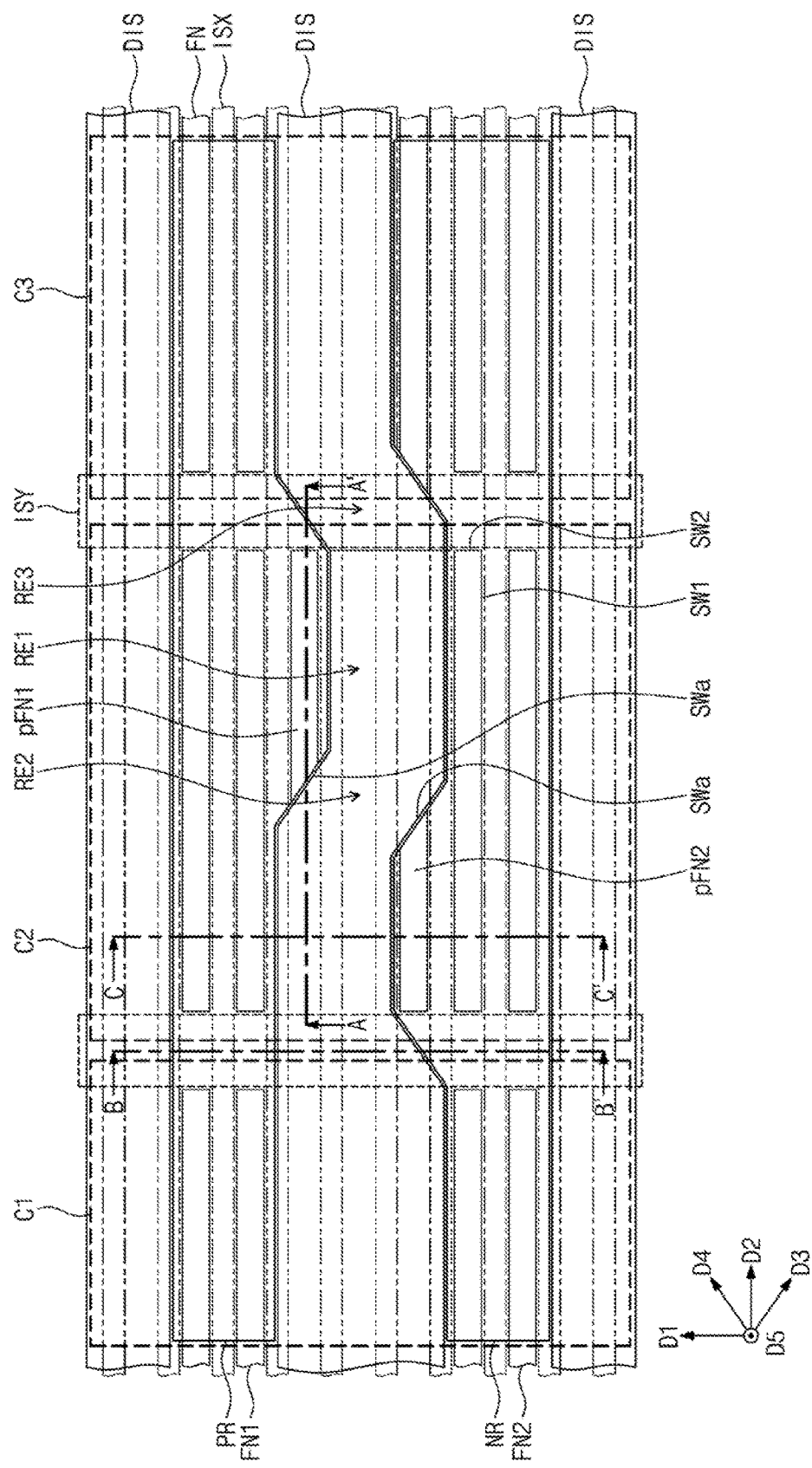
FIG. 1 is a plan view that illustrates active patterns of a semiconductor device according to exemplary embodiments of the present inventive concept.
Figure 2B:
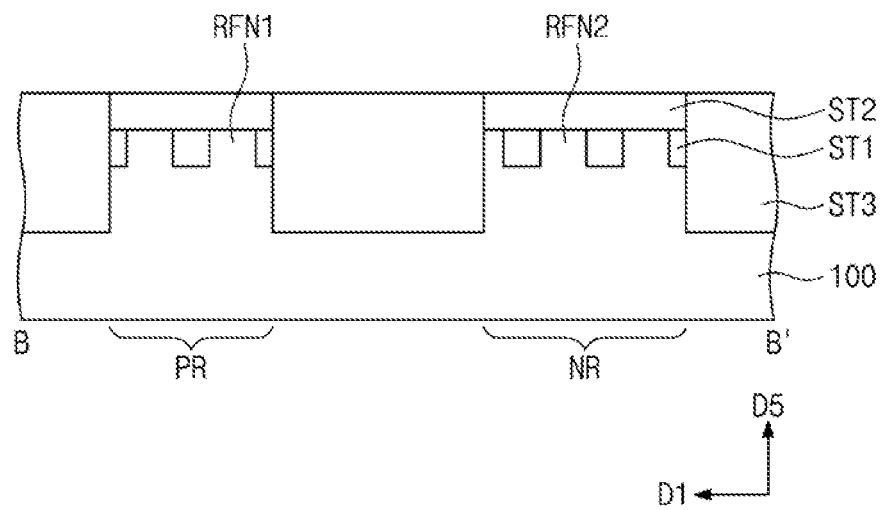
Figure 2C:
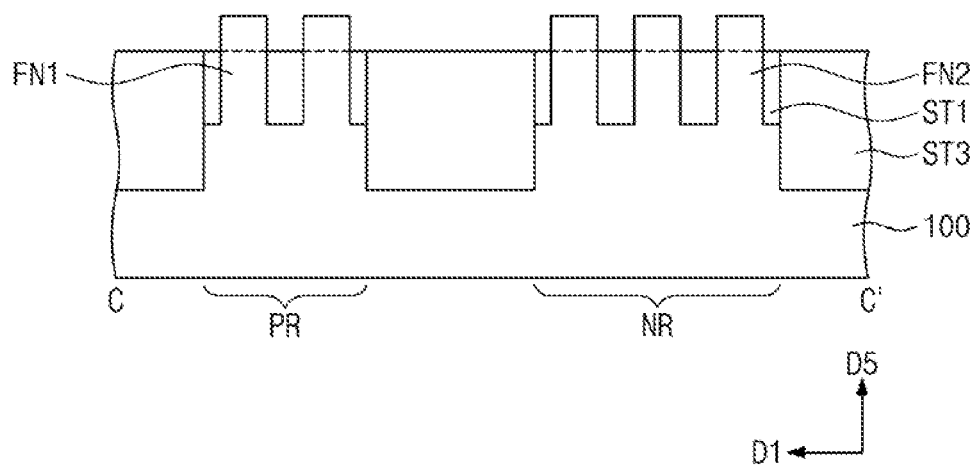
Figure 3:
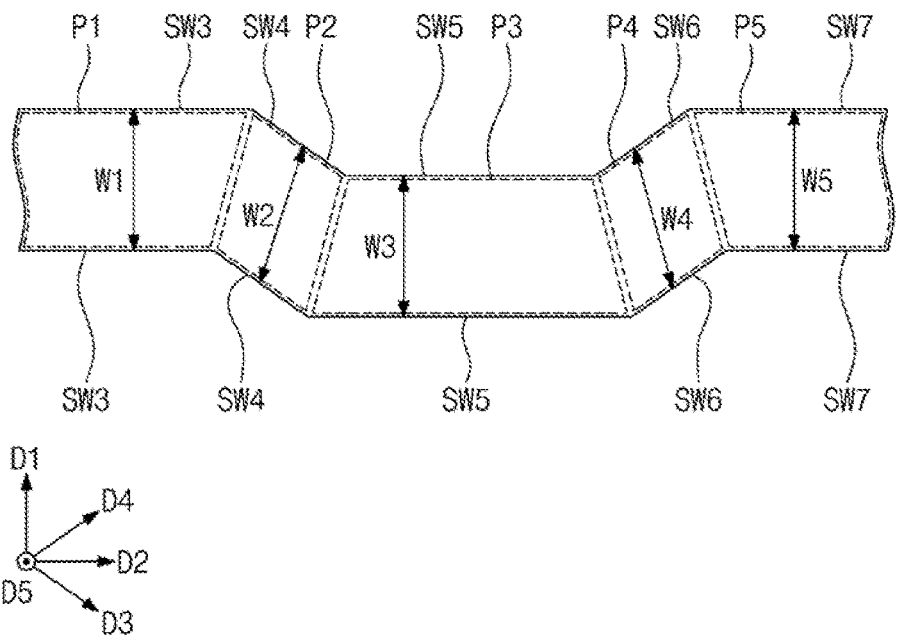
FIG. 3 is a plan view that partially shows a third device isolation layer of a semiconductor device according to exemplary embodiments of the present inventive concept.
Figure 4:
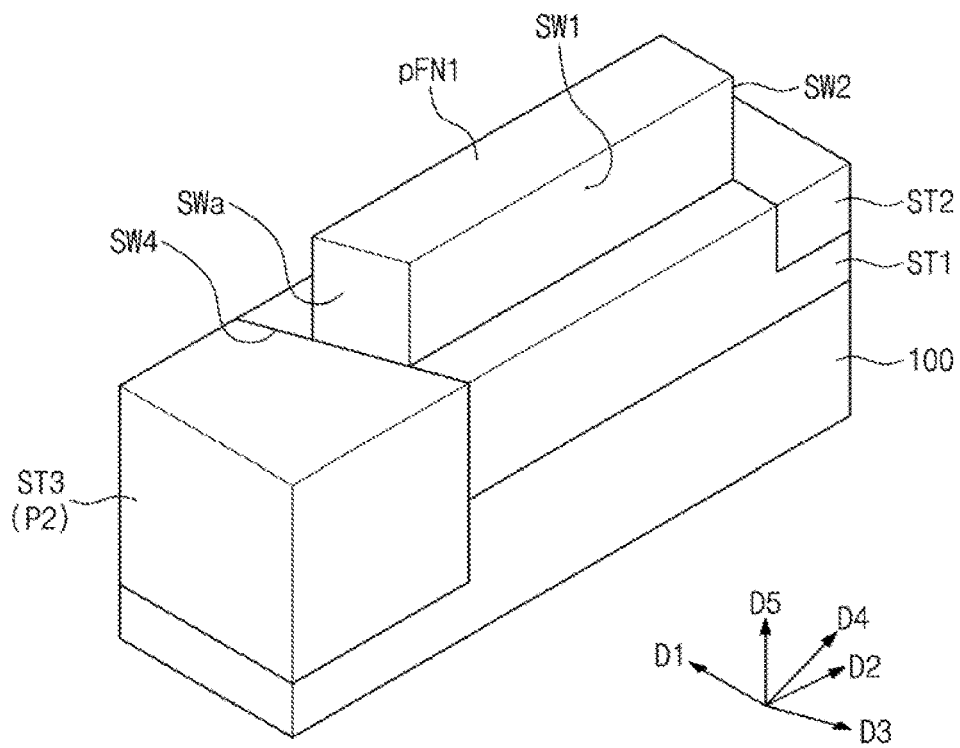
FIG. 4 is a perspective view that illustrates active patterns of a semiconductor device according to exemplary embodiments of the present inventive concept.

FIG. 1 is a plan view that illustrates active patterns of a semiconductor device according to exemplary embodiments of the present inventive concept. FIGS. 2A to 2C are cross-sectional views respectively taken along lines A-A', B-B', and C-C' of FIG. 1. FIG. 3 is a plan view that partially shows a third device isolation layer of a semiconductor device according to exemplary embodiments of the present inventive concept. FIG. 4 is a perspective view that illustrates active patterns of a semiconductor device according to exemplary embodiments of the present inventive concept. Herein below, it will be understood that the terms "first," "second," "third," etc. are used herein to distinguish one element from another, not to enumerate them. Thus, a "first" element in an exemplary embodiment may be introduced after a "second" element in that exemplary embodiment.

Referring to FIGS. 1, 2A to 2C, 3, and 4, according to exemplary embodiments, a substrate 100 is provided with first, second, and third cell regions C1, C2, and C3. The first to third cell regions C1 to C3 are arranged in a second direction D2. Each of the first to third cell regions C1 to C3 is a logic cell region where logic transistors are disposed to constitute a logic circuit of a semiconductor device. FIGS. 1 and 2A to 2C show arrangements of active patterns where the logic transistors are disposed. Substrate 100 may be a silicon substrate, a germanium substrate, or a silicon-on-insulator (SOI) substrate.

According to exemplary embodiments, the substrate 100 is provided with first isolation sections ISX, second isolation or diffusion break sections ISY, and deep isolation sections DIS. Active patterns FN1 and FN2 are disposed at positions other than those occupied by the first isolation sections ISX, the second isolation sections ISY, and the deep isolation sections DIS. For example, the active patterns FN1 and FN2 can be disposed on sections except for the first isolation sections ISX, the second isolation sections ISY, the deep isolation sections DIS, and crossing sections thereof.

According to exemplary embodiments, the first isolation sections ISX lie parallel to each other. The first isolation sections ISX extend in the second direction D2. As illustrated in FIG. 1, when considering the first isolation sections ISX, each of the active patterns FN1 and FN2 have first sidewalls SW1 parallel to the first isolation sections ISX.

According to exemplary embodiments, the second isolation sections ISY are parallel to each other and extend across the first isolation sections ISX. The second isolation sections ISY extend in a first direction D1. For example, the second isolation sections ISY vertically extend across the first isolation sections ISX. When considering the second isolation sections ISY, each of the active patterns FN1 and FN2 have second sidewalls SW2 parallel to the second isolation sections ISY. The second isolation sections ISY are disposed at boundaries between the first and second cell regions C1 and C2 and between the second and third cell regions C2 and C3.

According to exemplary embodiments, the first isolation sections ISX are substantially equally spaced apart from each other in the first direction D1. In this configuration, the active patterns FN1 and FN2 have substantially the same width in the first direction D1. A width of the first isolation section ISX in the first direction D1 is less than a width of the second isolation section ISY in the second direction D2. In this sense, a distance in the first direction D1 between adjacent active patterns FN1 and FN2 is than a distance in the second direction D2 between adjacent active patterns FN1 and FN2.

According to exemplary embodiments, each of the active patterns FN1 and FN2 has a length and a width defined by the first and second isolation sections ISX and ISY. Each of the active patterns FN1 and FN2 extends in the second direction D2 and has a width in the first direction D1.

According to exemplary embodiments, the deep isolation sections DIS are used to partially remove the active patterns FN1 and FN2 defined by the first and second isolation sections ISX and ISY. In some embodiments, the deep isolation sections DIS include on the substrate 100 a PMOSFET region PR and an NMOSFET region NR. The active patterns FN1 and FN2 include first active patterns FN1 on the PMOSFET region PR and second active patterns FN2 on the NMOSFET region NR.

According to exemplary embodiments, the deep isolation sections DIS extend in the second direction D2. The deep isolation section DIS between the PMOSFET and NMOSFET regions PR and NR meanderingly extends in the second direction D2. For example, the deep isolation section DIS between the PMOSFET and NMOSFET regions PR and NR can include a first division RE1 extending in the second direction D2, a second division RE2 extending in a third direction D3, and a third division RE3 extending in a fourth direction D4. Each of the third and fourth directions D3 and D4 cross both of the first and second directions D1 and D2. The third direction D3 is a direction between the second direction D2 and a reversed first direction D1, and the fourth direction D4 is a direction between the first and second directions D1 and D2.

According to exemplary embodiments, the deep isolation sections DIS determine the number of the first active patterns FN1 on the PMOSFET region PR and the number of the second active patterns FN2 on the NMOSFET region NR. For example, on the first cell region C1, there are two first active patterns FN1 and two second active patterns FN2. On the third cell region C3, there are two first active patterns FN1 and three second active patterns FN2. On the second cell region C2, there are two first active patterns FN1 on a first segment of the PMOSFET region PR, and three first active patterns FN1 on a second segment of the PMOSFET region PR. On the second cell region C2, there are three second active patterns FN2 on a first segment of the NMOSFET region NR, and two second active patterns FN2 on a second segment of the NMOSFET region NR. Since the second division RE2 is included in the deep isolation section DIS on the second cell region C2, the numbers of the first and second active patterns FN1 and FN2 changes on the second cell region C2.

According to exemplary embodiments, the first active patterns FN1 on the second cell region C2 include a first fragmentary active pattern pFN1 that is cut by the second division RE2 of the deep isolation section DIS. The second active patterns FN2 on the second cell region C2 include a second fragmentary active pattern pFN2 that is cut by the second division RE2 of the deep isolation section DIS. Each of the first and second fragmentary active patterns pFN1 and pFN2 has a length less than those of other active patterns FN1 and FN2.

According to exemplary embodiments, first, second, and third device isolation layers ST1, ST2, and ST3 are provided on an upper portion of the substrate 100. The first device isolation layers ST1 are provided on the first isolation sections ISX, the second device isolation layers ST2 are provided on the second isolation sections ISY, and the third device isolation layers ST3 are provided on the deep isolation sections DIS. Detailed descriptions of the first device isolation layers ST1, the second device isolation layers ST2, and the third device isolation layers ST3 are substantially the same as those of the first isolation sections ISX, the second isolation sections ISY, and the deep isolation sections DIS, respectively, described above.

According to exemplary embodiments, the first device isolation layers ST1 extend deeper than the second device isolation layers ST2. The third device isolation layers ST3 extend deeper than the first device isolation layers ST1. The first to third device isolation layers ST1 to ST3 are formed by separate processes. The first to third device isolation layers ST1 to ST3 have their top surfaces coplanar with each other. The first to third device isolation layers ST1 to ST3 include a silicon oxide layer.

According to exemplary embodiments, the upper portion of each of the first and second active patterns FN1 and FN2 is shaped like a fin that protrudes between the first device isolation layers ST1. The first and second active patterns FN1 and FN2 are portions of the substrate 100 that protrude from its top surface. The upper portions of the first and second active patterns FN1 and FN2 vertically protrude above the first device isolation layers ST1. Each upper portion of the first and second active patterns FN1 and FN2 has a fin shape that protrudes between a pair of the first device isolation layers ST1.

Referring back to FIGS. 1 and 2B, according to exemplary embodiments, each of the second device isolation layers ST2 separates the upper portions of the first and second active patterns FN1 and FN2 from each other in the second direction D2. The second device isolation layer ST2 extends across the upper portions of the first and second active patterns FN1 and FN2. Lower portions of the first and second active patterns FN1 and FN2 are below the second device isolation layer ST2. The lower portions of the first active patterns FN1 can be referred to as first recessed active patterns RFN1, and the lower portions of the second active patterns FN2 can be referred to as second recessed active patterns RFN2. The first device isolation layers ST1 are interposed between the recessed active patterns RFN1 and RFN2 below the second device isolation layer ST2. The second device isolation layer ST2 covers top surfaces of the recessed active patterns RFN1 and RFN2 and also covers top surfaces of the first device isolation layers ST1.

Referring back to FIGS. 1 and 3, according to exemplary embodiments, the third device isolation layer ST3 disposed between the PMOSFET and NMOFET regions PR and NR includes first to fifth parts P1 to P5. The first, third, and fifth parts P1, P3, and P5 extend in the second direction D2, the second part P2 extends in the third direction D3, and the fourth part P4 extends in the fourth direction D4. The second part P2 is interposed between the first and third parts P1 and P3, and the fourth part P4 is interposed between the third and fifth parts P3 and P5. The second part P2 is positioned on the second cell region C2, and the fourth part P4 is positioned at the boundary between the second and third cell regions C2 and C3.

According to exemplary embodiments, the first part P1 has opposite sidewalls SW3 that face each other, the second part P2 has opposite sidewalls SW4 that face each other, the third part P3 has opposite sidewalls SW5 that face each other, the fourth part P4 has opposite sidewalls SW6 that face each other, and the fifth part P5 has opposite sidewalls SW7 that face each other. The sidewalls SW3, SW5, and SW7 of the first, third, and fifth parts P1, P3, and P5 are parallel to the second direction D2. The sidewalls SW4 of the second part P2 are parallel to the third direction D3, and the sidewalls SW6 of the fourth part P4 are parallel to the fourth direction D4.

For example, according to exemplary embodiments, the first part P1 has a first width W1, the second part P2 has a second width W2, the third part P3 has a third width W3, the fourth part P4 has a fourth width W4, and the fifth part P5 has a fifth width W5. The first width W1 is a distance between opposite sidewalls SW3 of the first part P1, the second width W2 is a distance between opposite sidewalls SW4 of the second part P2, the third width SW3 is a distance between opposite sidewalls SW5 of the third part P3, the fourth width W4 is a distance between opposite sidewalls SW6 of the fourth part P4, and the fifth width W5 is a distance between opposite sidewalls SW7 of the fifth part P5. The first to fifth widths W1 to W5 are substantially equal to each other. For example, the third device isolation layer ST3 between the PMOSFET and NMOSFET regions PR and NR extends from the second cell region C2 toward the third cell region C3 while maintaining its constant width.

According to exemplary embodiments, the first fragmentary active pattern pFN1 is described below in detail with reference back to FIGS. 1, 3, and 4. The first fragmentary active pattern pFN1 are surrounded by a pair of the first device isolation layers ST1, the second device isolation layer ST2, and the third device isolation layer ST3. The first fragmentary active pattern pFN1 has a sidewall SWa inclined in the third direction D3. The inclined sidewall SWa is opposite to the second sidewall SW2 parallel to the second isolation section ISY, i.e., the second device isolation layer ST2. The inclined sidewall SWa is vertically aligned with the sidewall SW4 of the second part P2 of the third device isolation layer ST3.

Figure 5:
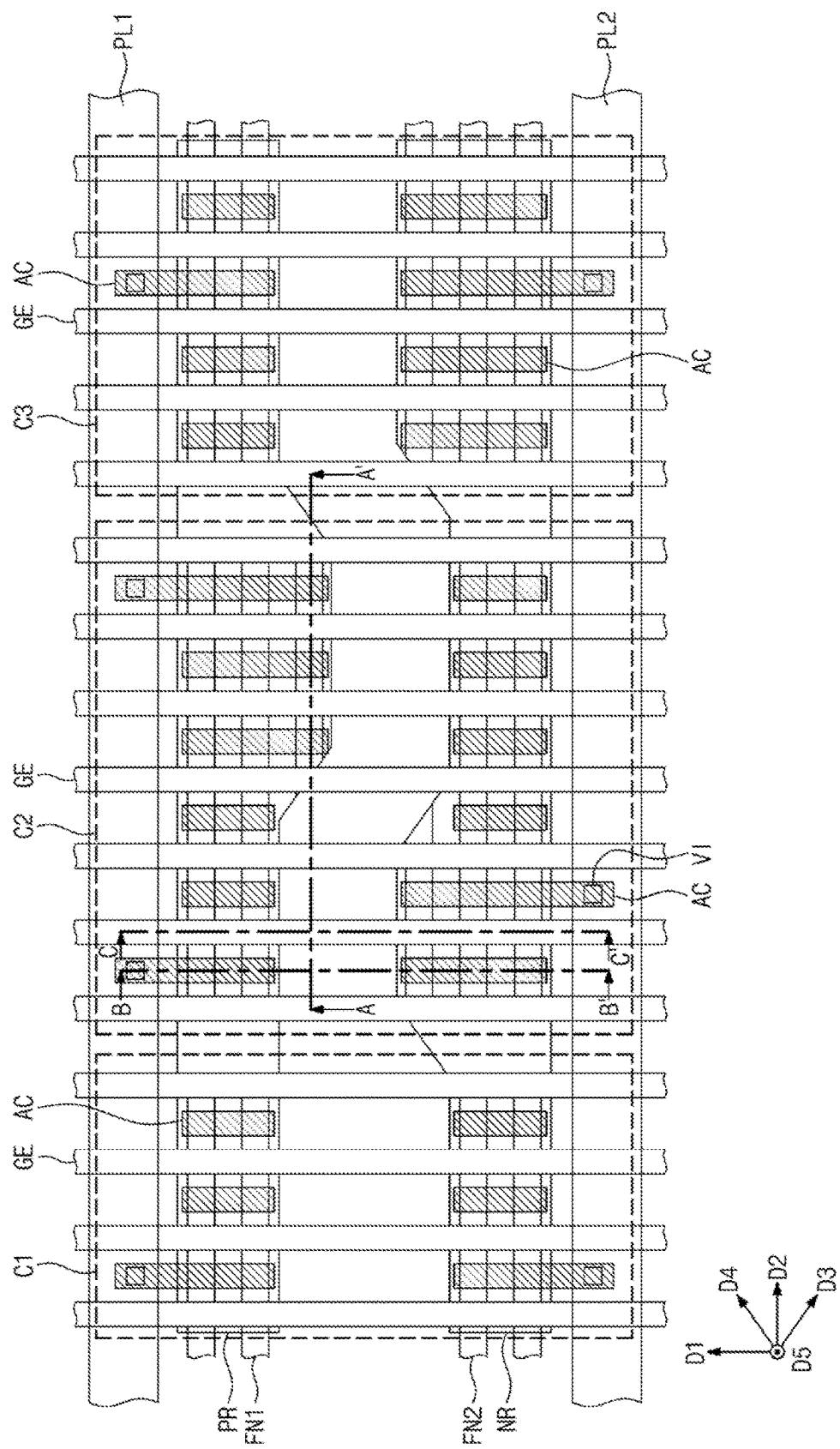
FIG. 5 is a plan view that illustrates a semiconductor device according to exemplary embodiments of the present inventive concept.
Figure 6A:
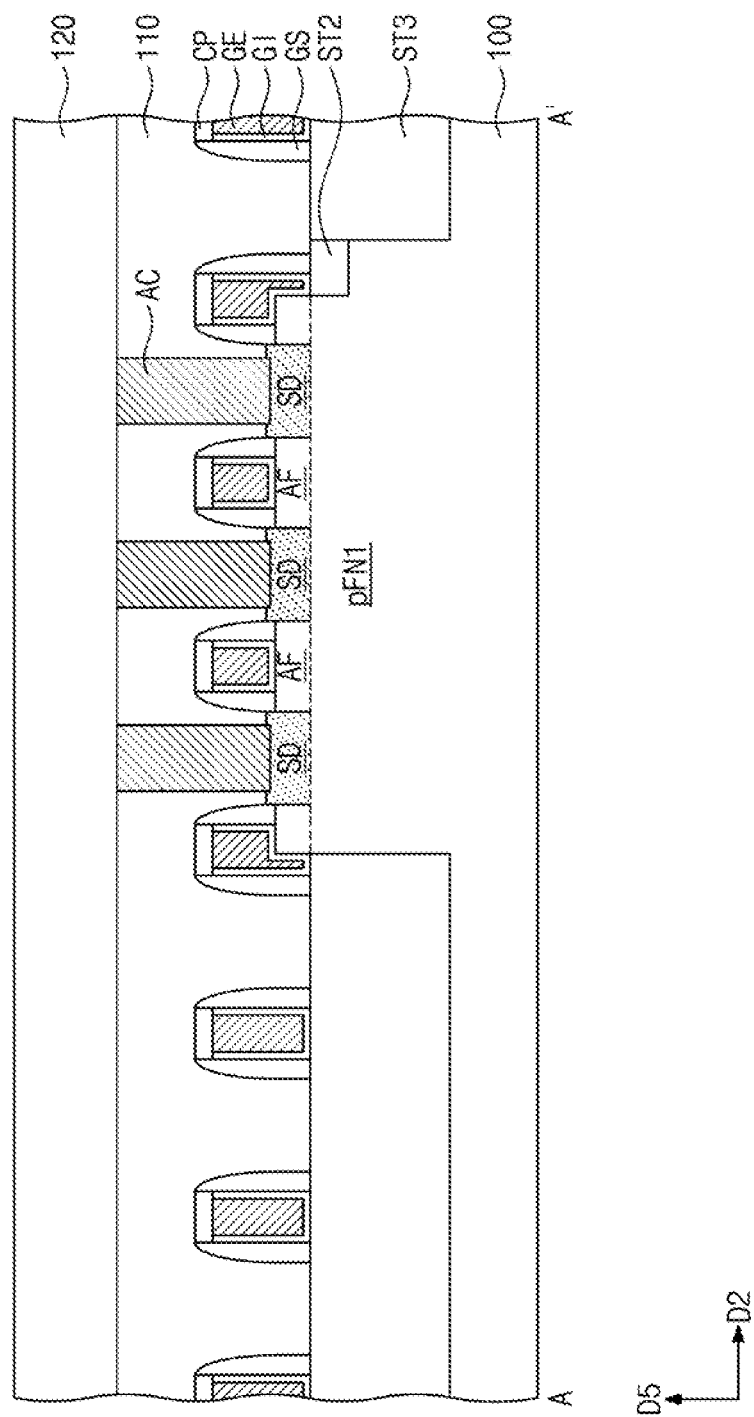
FIGS. 6A to 6C are cross-sectional views respectively taken along lines A-A', B-B', and C-C' of FIG. 5.
Figure 6B:
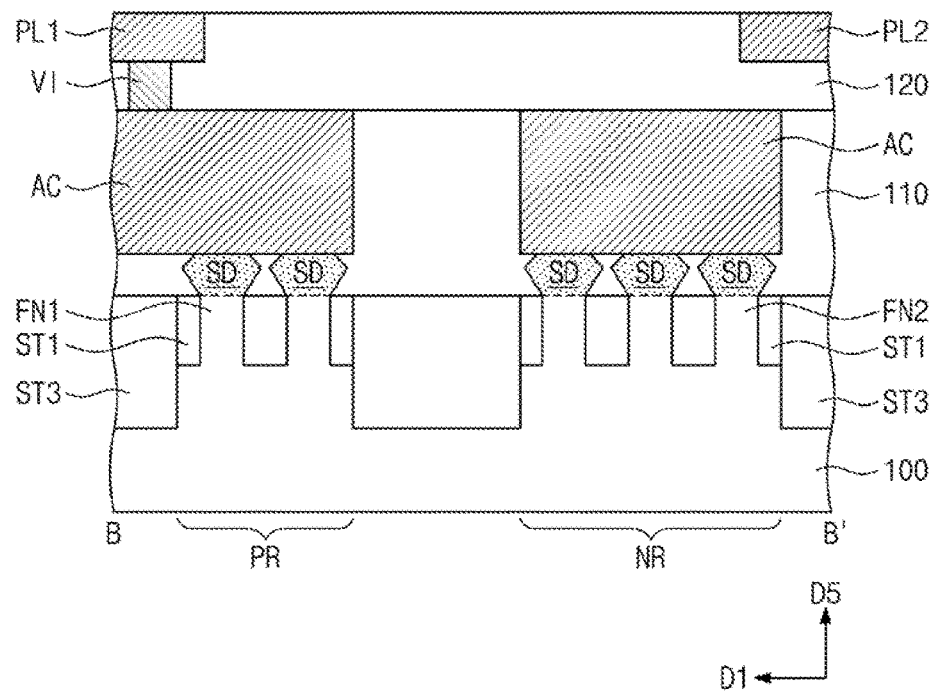
Figure 6C:
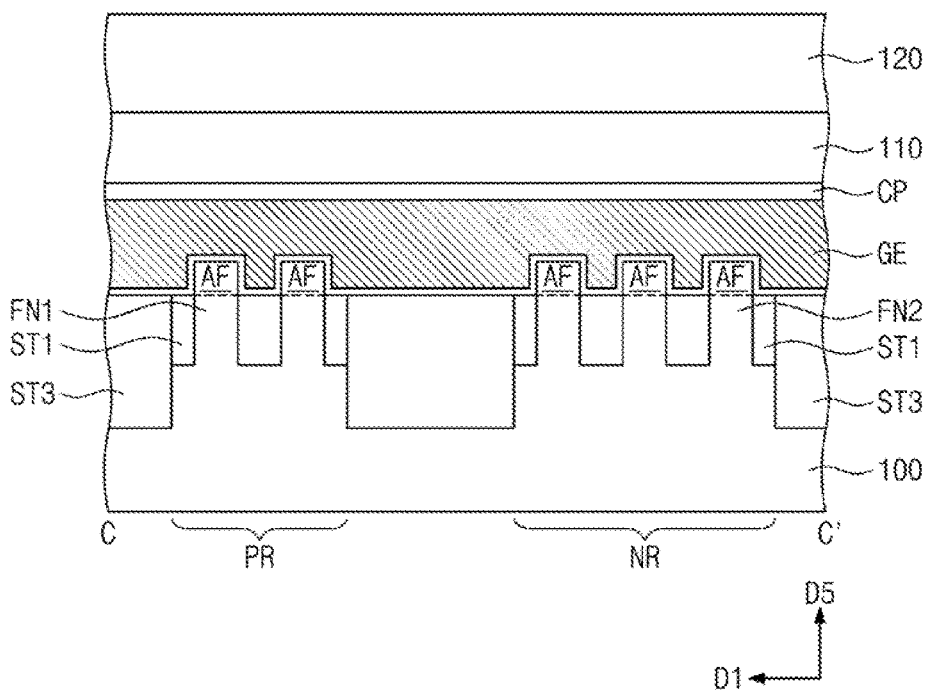

FIG. 5 is a plan view that illustrates a semiconductor device according to exemplary embodiments of the present inventive concept. FIGS. 6A to 6C are cross-sectional views respectively taken along lines A-A', B-B', and C-C' of FIG. 5. In a following embodiment, detailed descriptions of technical features similar to those described with reference to FIGS. 1 to 4 will be omitted and differences will be described in detail.

Referring to FIGS. 5 and 6A to 6C, according to exemplary embodiments, a substrate 100 is provided with first, second, and third cell regions C1, C2, and C3. Each of the first to third cell regions C1 to C3 is a logic cell region where logic transistors are disposed to constitute a logic circuit of a semiconductor device. For example, each of the first to third cell regions C1 to C3 may be provided thereon with logic transistors constituting a processor core or an I/O terminal. Each of the first to third cell regions C1 to C3 may be a portion of the process core or the I/O terminal.

According to exemplary embodiments, the substrate 100 is provided with third device isolation layers ST3 that define a PMOSFET region PR and an NMOSFET region NR. The third device isolation layers ST3 are formed on an upper portion of the substrate 100. The PMOSFET region PR and the NMOSFET region NR are spaced apart from each other in a first direction D1 by the third device isolation layer ST3.

According to exemplary embodiments, the PMOSFET region PR is provided thereon with a plurality of first active patterns FN1 that extend in a second direction D2. The NMOSFET region NR is provided thereon with a plurality of second active patterns FN2 that extend in the second direction D2. First device isolation layers ST1 that extend in the second direction D2 are provided on opposite sides of each of the first and second active patterns FN1 and FN2.

According to exemplary embodiments, the second device isolation layers ST2 are disposed at boundaries between the first and second cell regions C1 and C2 and between the second and third cell regions C2 and C3. The active patterns FN1 and FN2 are separated from each other in the second direction D2 between adjacent cell regions C1 to C3 by the second device isolation layers ST2.

According to exemplary embodiments, detailed descriptions of the first and second active patterns FN1 and FN2 and the first to third device isolation layers ST1 to ST3 are substantially the same as those described with reference to FIGS. 1 to 4.

According to exemplary embodiments, gate electrodes GE are disposed that extend in the first direction D1 across the first and second active patterns FN1 and FN2. The gate electrodes GE are spaced apart from each other in the second direction D2. The gate electrodes GE extending in the first direction D1 cross the NMOSFET region NR, the third device isolation layer ST3, and the PMOSFET region PR. Each of the second device isolation layers ST2 is provided thereon with a pair of the gate electrodes GE.

According to exemplary embodiments, a gate dielectric pattern GI is disposed below each of the gate electrodes GE. Gate spacers GS are disposed on opposite sides of each of the gate electrodes GE. A capping pattern CP is disposed to cover a top surface of each of the gate electrodes GE.

According to exemplary embodiments, the gate dielectric pattern GI vertically extends to cover opposite sidewalls of the gate electrode GE. In this configuration, the gate dielectric pattern GI is interposed between the gate electrode GE and the gate spacers GS. First and second interlayer dielectric layers 110 and 120 are disposed to cover the gate electrodes GE and the first and second active patterns FN1 and FN2.

According to exemplary embodiments, the gate electrodes GE may include one or more of a doped semiconductor, a conductive metal nitride, such as titanium nitride, tantalum nitride, etc., or a metal, such as aluminum, tungsten, etc. The gate dielectric pattern GI may include a silicon oxide layer, a silicon oxynitride layer, or a high-k dielectric layer whose dielectric constant is greater than that of a silicon oxide layer. Each of the capping patterns CP and the gate spacers GS may include one or more of a silicon oxide layer, a silicon nitride layer, or a silicon oxynitride layer. Each of the first and second interlayer dielectric layers 110 and 120 may include a silicon oxide layer or a silicon oxynitride layer.

According to exemplary embodiments, source/drain regions SD are disposed on upper portions of the first and second active patterns FN1 and FN2. A pair of the source/drain regions SD is positioned on opposite sides of each of the gate electrodes GE. The source/drain regions SD on the PMOSFET region PR are doped with p-type impurities, and the source/drain regions SD on the NMOSFET region NR are doped with n-type impurities. Channel regions AF are provided on the upper portions of the first and second active patterns FN1 and FN2. The channel regions AF vertically overlap the gate electrodes GE. Each of the channel regions AF is interposed between a pair of the source/drain regions SD.

According to exemplary embodiments, the source/drain regions SD are epitaxial patterns formed by a selective epitaxial growth process. The source/drain regions SD have top surfaces higher than those of the channel regions AF. The source/drain regions SD include a semiconductor element different from that of the substrate 100. For example, the source/drain regions SD can be formed of a semiconductor element whose lattice constant is greater or less than that of a semiconductor element of the substrate 100. Since the source/drain regions SD include a semiconductor element that differs from that of the substrate 100, the channel regions AF is provided with a compressive stress or a tensile stress.

According to exemplary embodiments, active contacts AC are disposed in the first interlayer dielectric layer 110. The active contacts AC have top surfaces substantially coplanar with that of the first interlayer dielectric layer 110. The active contacts AC are disposed on each of the PMOSFET and NMOSFET regions PR and NR. The active contacts AC are disposed between the gate electrodes GE. The active contacts AC have a linear shape that extends in the first direction D1. Each of the active contacts AC is directly connected to the source/drain regions SD. Although a present embodiment illustrates each of the active contacts AC as being connected to a plurality of the source/drain regions SD, embodiments are not limited thereto. For example, at least one active contact AC can be coupled to one source/drain region SD, two source/drain regions SD, or three source/drain regions SD. The active contacts AC may include, for example, one or more of a conductive metal nitride, such as titanium nitride, tantalum nitride, etc., or a metal, such as aluminum, tungsten, etc.

According to exemplary embodiments, barrier patterns can be provided between the first interlayer dielectric layer 110 and the active contacts AC. Each of the barrier patterns directly covers bottom and side surfaces of the active contact AC, but not the top surfaces. The barrier patterns may include a metal nitride, such as TiN.

According to exemplary embodiments, the second interlayer dielectric layer 120 has disposed therein vias VI and first and second power lines PL1 and PL2. The first and second power lines PL1 and PL2 extend along the second direction D2. The first and second power lines PL1 and PL2 have top surfaces substantially coplanar with that of the second interlayer dielectric layer 120.

According to exemplary embodiments, the via VI is interposed between the first power line PL1 and at least one active contact AC. The first power line PL1 is electrically connected to at least one active contact AC through the via VI. The via VI is interposed between the second power line PL2 and at least one active contact AC. The second power line PL2 is electrically connected to at least one active contact AC through the via VI. The first power line PL1 may be integrally connected to its corresponding via VI, or the second power line PL2 may be integrally connected to its corresponding via VI.

According to exemplary embodiments, the first power line PL1 supplies a power voltage to the source/drain regions SD through the via VI and at least one active contact AC. The second power line PL2 supplies a ground voltage to the source/drain regions SD through the via VI and at least one active contact AC.

According to exemplary embodiments, the second interlayer dielectric layer 120 can have additional conductive lines disposed therein. The conductive lines are electrically connected to either at least one active contact AC or at least one gate electrode GE through the vias VI.

According to exemplary embodiments, barrier patterns can be disposed between the second interlayer dielectric layer 120 and the first and second power lines PL1 and PL2 and between the second interlayer dielectric layer 120 and the additional conductive lines.

According to embodiments of the present inventive concept, each of the cell regions C1, C2, and C3 can be reduced in length in the first direction D1 by reducing sizes of the PMOSFET and NMOSFET regions PR and NR or by decreasing a width of the third device isolation layer ST3, i.e., a distance between the PMOSFET and NMOFET regions PR and NR. As such, each of the cell regions C1, C2, C3 decreases in size. In addition, the third device isolation layer ST3 has a meandering shape that increases the number of the first active patterns FN1 on a zone that requires high performance from the PMOSFETs and that increases the number of the second active patterns FN2 on a zone that requires high performance from the NMOSFETs. As a result, it is possible to fabricate a highly integrated semiconductor device that has excellent performance.

Figure 7:
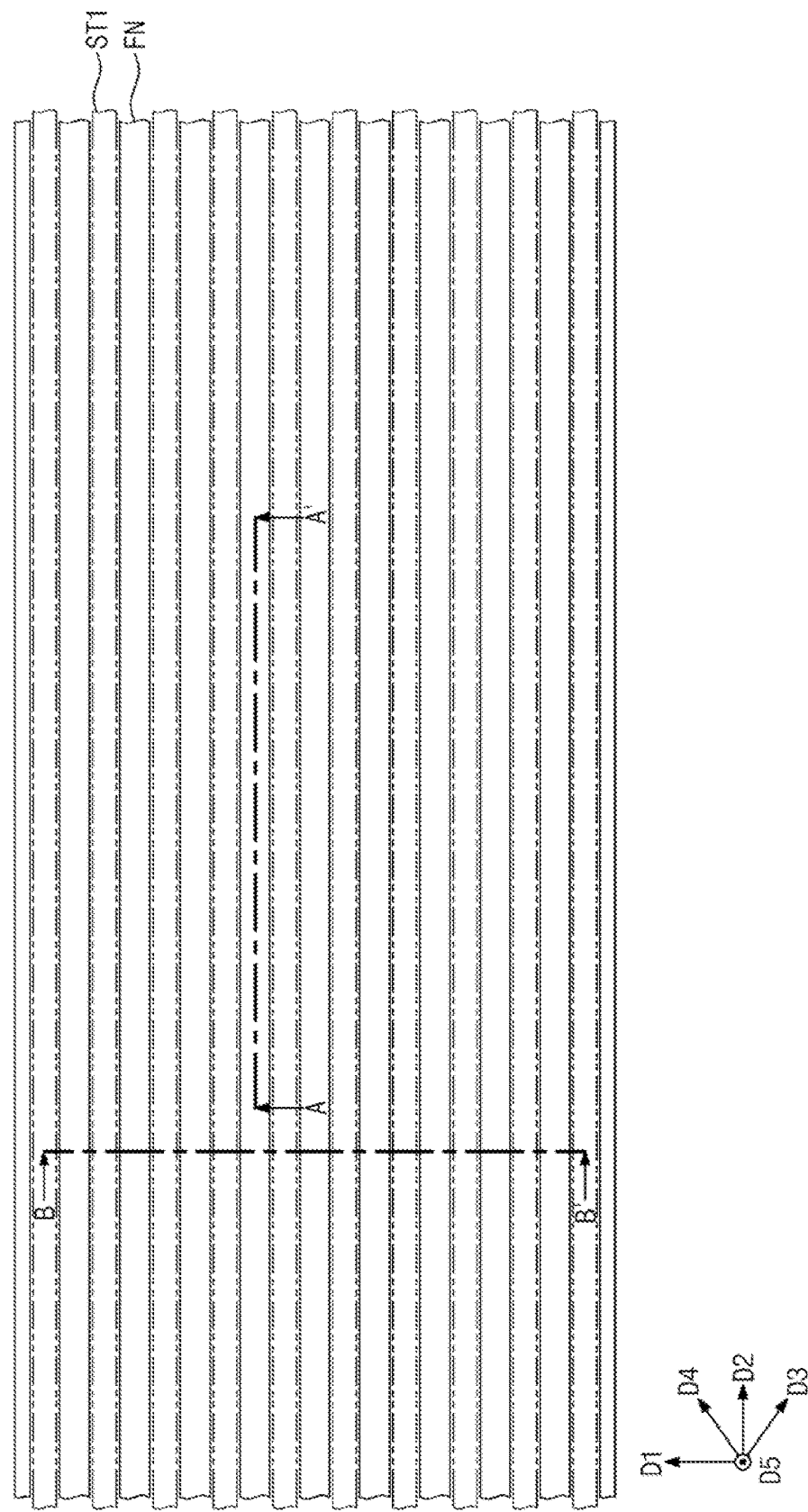
FIGS. 7, 9, and 11 are plan views that illustrate a method of fabricating a semiconductor device according to exemplary embodiments of the present inventive concept.
Figure 8A:
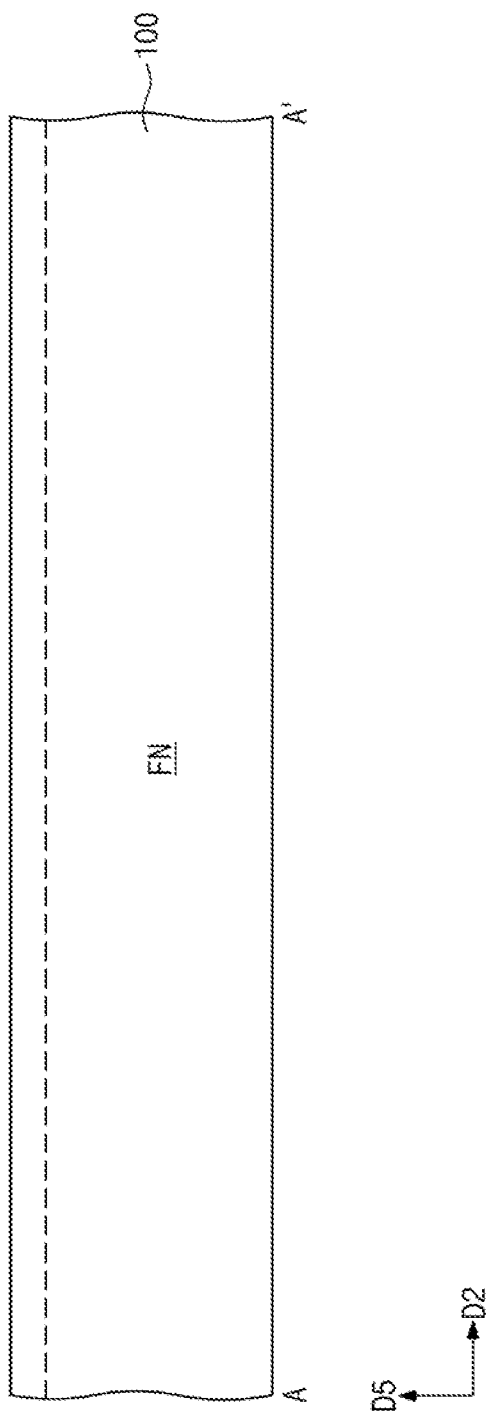
Figure 8B:
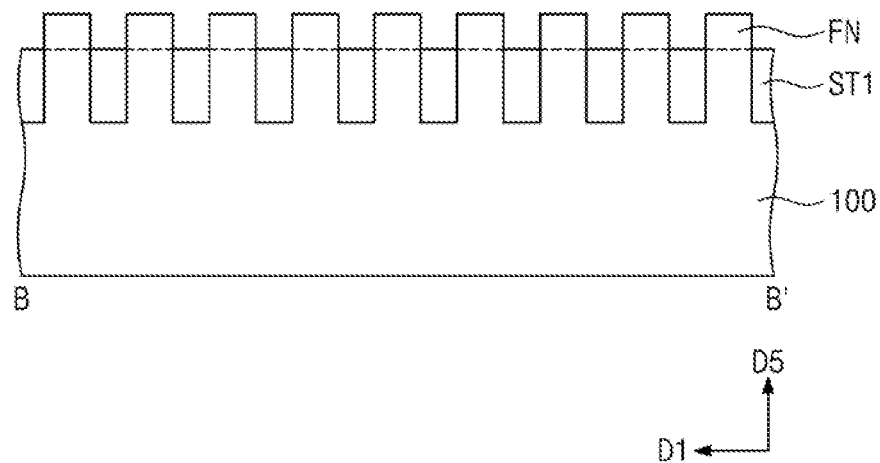
FIGS. 8B, 10B, and 12B are cross-sectional views that correspond to line B-B' of FIGS. 7, 9, and 11, respectively.
Figure 9:
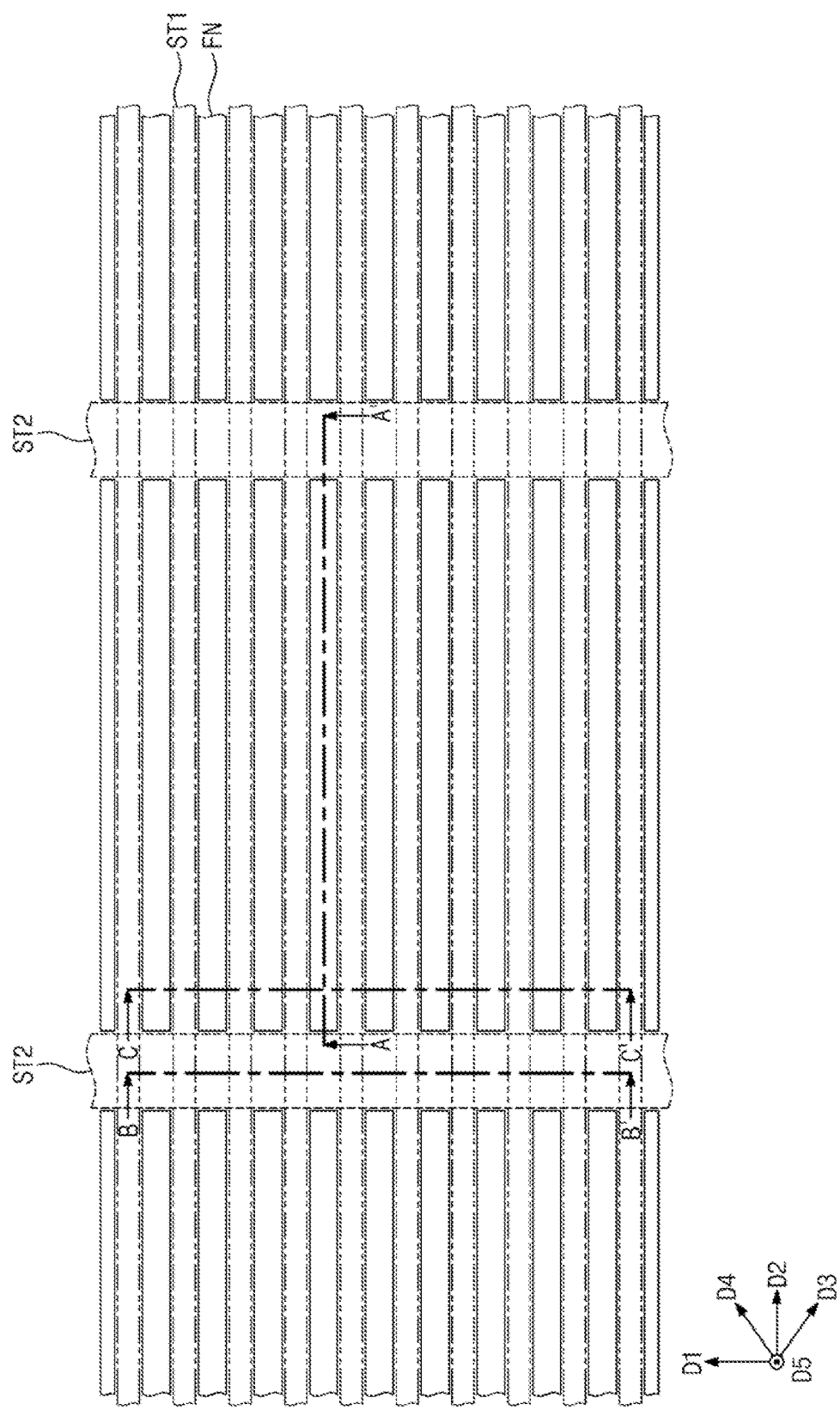
Figure 10A:
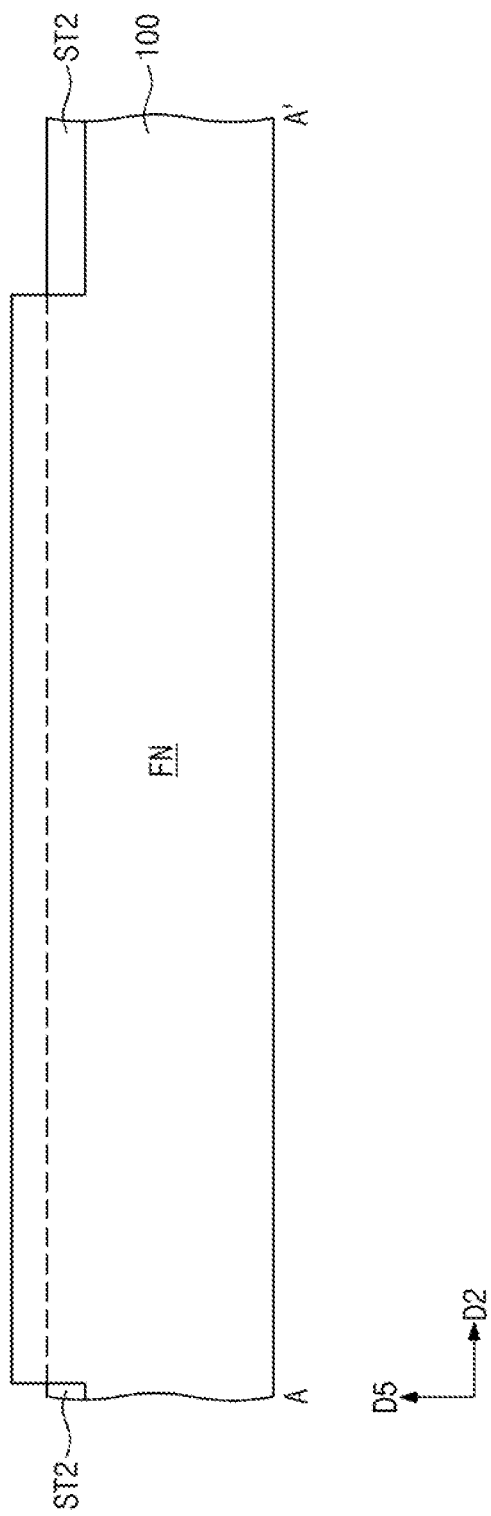
Figure 10B:
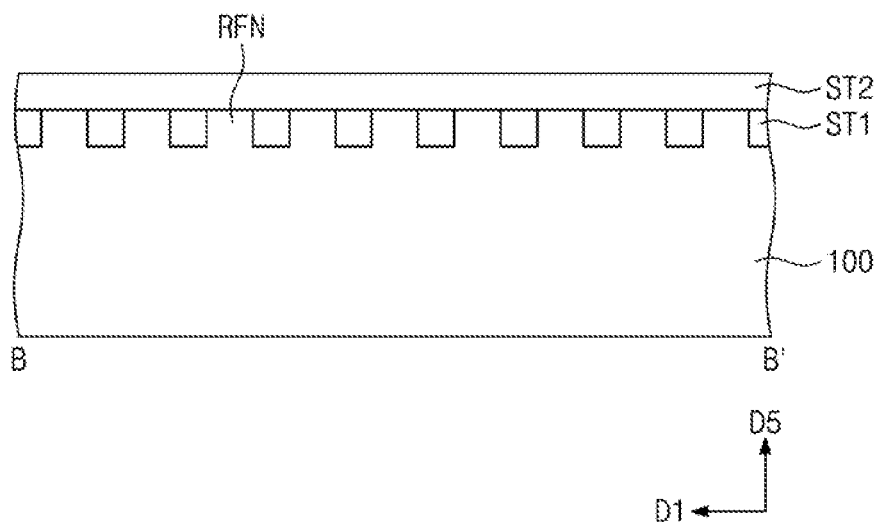
Figure 10C:
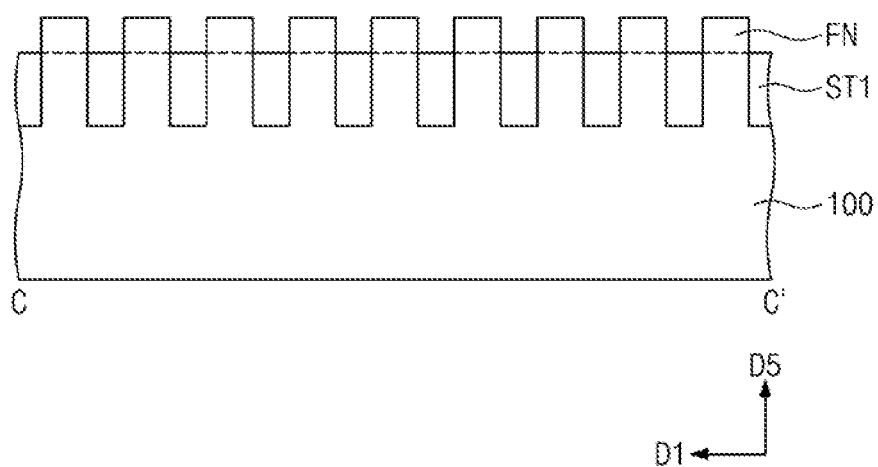
FIGS. 10C and 12C are cross-sectional views that correspond to line C-C' of FIGS. 9 and 11, respectively.
Figure 11:
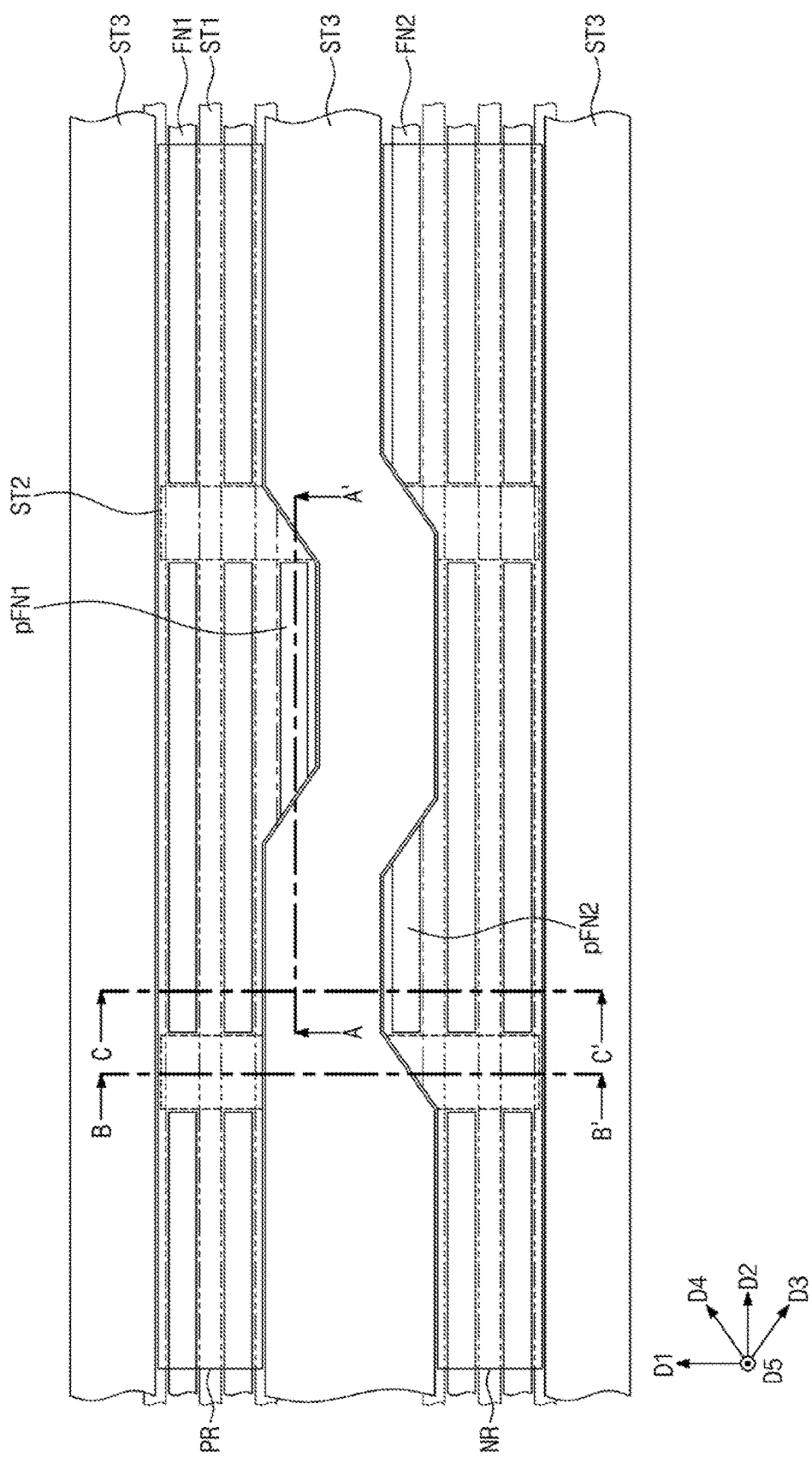
Figure 12B:
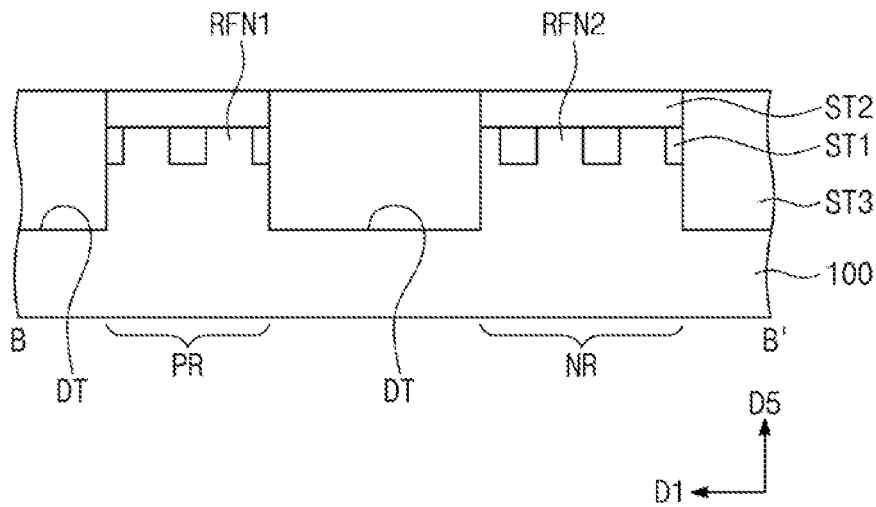
Figure 12C:
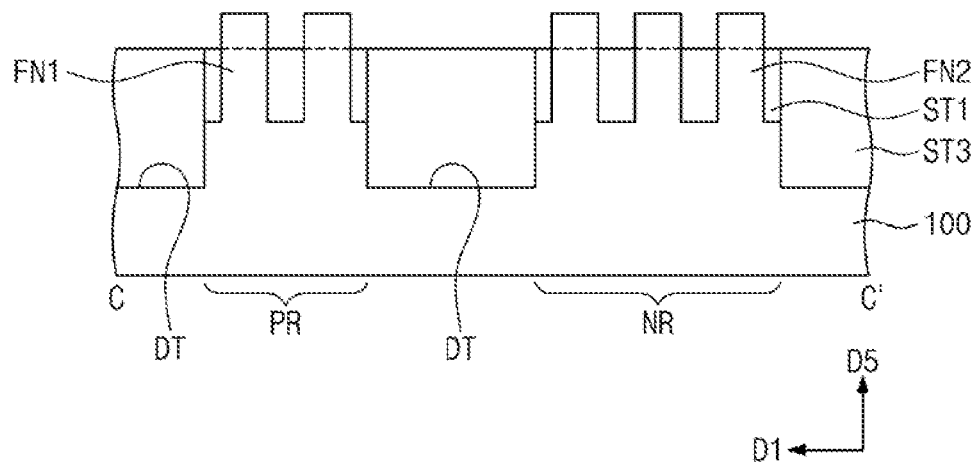

FIGS. 7, 9, and 11 are plan views that illustrate a method of fabricating a semiconductor device according to exemplary embodiments of the present inventive concept. FIGS. 8A, 10A, and 12A are cross-sectional views that correspond to line A-A' of FIGS. 7, 9, and 11, respectively. FIGS. 8B, 10B, and 12B are cross-sectional views that correspond to line B-B' of FIGS. 7, 9, and 11, respectively. FIGS. 10C and 12C are cross-sectional views that correspond to line C-C' of FIGS. 9 and 11, respectively.

Referring to FIGS. 7, 8A, and 8B, according to exemplary embodiments, a substrate 100 is provided. For example, the substrate 100 may be a silicon substrate, a germanium substrate, or a silicon-on-insulator (SOI) substrate. An upper portion of the substrate 100 is patterned to form active patterns FN. The active patterns FN have a linear shape that extends in a second direction D2.

According to exemplary embodiments, first device isolation layers ST1 are formed to fill spaces between the active patterns FN. The formation of the first device isolation layers ST1 includes forming an insulation layer on the substrate 100 that covers the active patterns FN and recessing the insulation layer to expose upper portions of the active patterns FN. For example, silicon oxide can be used to form the first device isolation layers ST1.

Referring to FIGS. 9 and 10A to 10C, according to exemplary embodiments, second device isolation layers ST2 that extend across the active patterns FN are disposed on the upper portion of the substrate 100. The second device isolation layers ST2 have a linear shape that extends in a first direction D1. The second device isolation layers ST2 have a width greater than those of the first device isolation layers ST1. The second device isolation layers ST2 have a top surface coplanar with an uppermost top surface of the first device isolation layer ST1.

According to exemplary embodiments, the formation of the second device isolation layer ST2 includes performing a recessing process on upper portions of those active patterns FN on a section, such as the second isolation section ISY shown in FIG. 1, that extend in the first direction D1. The recessing process removes upper portions of the active patterns FN, leaving their lower portions. The remaining lower portions of the active patterns FN constitute recessed active patterns RFN. When the active patterns FN have recessed upper portions, neighboring first device isolation layers ST1 also have recessed upper portions. The recessed first device isolation layers ST1 have top surfaces coplanar with those of the recessed active patterns RFN. The second device isolation layer ST2 is disposed on the recessed active patterns RFN and the recessed first device isolation layers ST1. The second device isolation layers ST2 may be formed from silicon oxide.

Referring to FIGS. 11 and 12A to 12C, according to exemplary embodiments, third device isolation layers ST3 are disposed on upper portions of the substrate 100 that define a PMOSFET region PR and an NMOSFET region NR. The third device isolation layers ST3 extend in the second direction D2. The third device isolation layer ST3 between the PMOSFET and NMOSFET regions PR and NR meanderingly extend in the second direction D2. The active patterns FN can be classified into first active patterns FN1 on the PMOSFET region PR and second active patterns FN2 on the NMOSFET region NR. The recessed active patterns RFN can be classified into first recessed active patterns RFN composed of lower portions of the first active patterns FN1 and second recessed active patterns RFN2 composed of lower portions of the second active patterns FN2.

According to exemplary embodiments, mask patterns are disposed on the substrate 100 that vertically overlap the PMOSFET and NMOSFET regions PR and NR. The mask patterns are formed by a photolithography process that is performed once. The mask patterns are spaced apart by a distance equal to a width of the third device isolation layer ST3. Even where the third device isolation layer ST3 has a meandering shape, the width of the third device isolation layer ST3 is consistently greater than a predetermined value (see FIG. 3). The width of the third device isolation layer ST3 is the equal to or greater than a minimum distance between patterns defined by the resolution of the photolithography process.

According to exemplary embodiments, the mask patterns are used as an etch mask to etch upper portions of the substrate 100 to form deep trenches DT. The deep trenches DT are deeper than the first and second device isolation layers ST1 and ST2. The third device isolation layers ST3 fill the deep trenches DT. The third device isolation layers ST3 may be formed from silicon oxide.

In a method of fabricating a semiconductor device according to exemplary embodiments of the present inventive concept, because the third device isolation layer ST3 has a constant width, the PMOSFET and NMOSFET regions PR and NR can be defined by the photolithography process that is performed once, not several times.

Referring back to FIGS. 5 and 6A to 6C, according to exemplary embodiments, gate electrodes GE are formed that extend in the first direction D1 and cross the first and second active patterns FN1 and FN2. The gate electrodes GE are spaced apart from each other in the second direction D2. A gate dielectric pattern GI is formed below each of the gate electrodes GE. Gate spacers GS are formed on opposite sides of each of the gate electrodes GE. A capping pattern CP is formed that covers a top surface of each of the gate electrodes GE.

In detail, according to exemplary embodiments, forming the gate electrodes GE includes forming sacrificial patterns that cross the first and second active patterns FN1 and FN2, forming the gate spacers GS on opposite sides of each of the sacrificial patterns, and replacing the sacrificial patterns with the gate electrodes GE.

According to exemplary embodiments, gate electrodes GE may include one or more of a doped semiconductor, a metal, or a conductive metal nitride. The gate dielectric pattern GI may include a silicon oxide layer, a silicon oxynitride layer, or a high-k dielectric layer whose dielectric constant is greater than that of a silicon oxide layer. Each of the capping patterns CP and the gate spacers GS may include one or more of a silicon oxide layer, a silicon nitride layer, or a silicon oxynitride layer.

According to exemplary embodiments, source/drain regions SD are formed on upper portions of the first and second active patterns FN1 and FN2. The source/drain regions SD are formed on opposite sides of each of the gate electrodes GE. The source/drain regions SD on the PMOSFET region PR are doped with p-type impurities, and the source/drain regions SD on the NMOSFET region NR are doped with n-type impurities.

In detail, according to exemplary embodiments, the source/drain regions SD are epitaxial patterns formed by a selective epitaxial growth process. The first and second active patterns FN1 and FN2 are partially recessed on opposite sides of each of the gate electrodes GE, and then the epitaxial growth process is performed on the recessed portions of the first and second active patterns FN1 and FN2. The epitaxial growth process is performed using a semiconductor element different from that of the substrate 100. For example, the source/drain regions SD can be formed of a semiconductor element whose lattice constant is greater than or less than that of a semiconductor element of the substrate 100. Since the source/drain regions SD are formed of a semiconductor element that differs from that of the substrate 100, a compressive or tensile stress is provided to channel regions AF between the source/drain regions SD.

According to exemplary embodiments, a first interlayer dielectric layer 110 is formed that covers the source/drain regions SD and the gate electrodes GE. The first interlayer dielectric layer 110 may be formed of a silicon oxide layer or a silicon oxynitride layer.

According to exemplary embodiments, active contacts AC are formed in the first interlayer dielectric layer 110. The active contacts AC are formed on the source/drain regions SD of the PMOSFET and NMOSFET regions PR and NR. The active contacts AC have a linear or bar shape that extends in the first direction D1.

In detail, according to exemplary embodiments, the first interlayer dielectric layer 110 is patterned to form holes for the active contacts AC. The holes are formed by performing a photolithography process several times using different photomasks. The holes are not formed at the same time. The holes are filled with a conductive material to form the active contacts AC. The conductive material may include one or more of a metal or a conductive metal nitride.

According to exemplary embodiments, a second interlayer dielectric layer 120 is formed on the first interlayer dielectric layer 110. The second interlayer dielectric layer 120 may be formed of a silicon oxide layer or a silicon oxynitride layer. Vias VI and first and second power lines PL1 and PL2 are formed in the second interlayer dielectric layer 120. The first power line PL1 is formed on at least one active contact AC and is electrically connected to the at least one active contact AC through the via VI. The second power line PL2 is formed on at least one active contact AC and is electrically connected to the at least one active contact AC through the via VI.

According to exemplary embodiments, the first and second power lines PL1 and PL2 can be formed simultaneously with the vias VI. For example, a dual damascene process can be performed to form the first and second power lines PL1 and PL2 and the vias VI. In detail, the second interlayer dielectric layer 120 is patterned to form holes for the first and second power lines PL1 and PL2 and the vias VI. The holes are filled with a conductive material to simultaneously form the first and second power lines PL1 and PL2 and the vias VI. The conductive material may include one or more of a metal or a conductive metal nitride.

According to exemplary embodiments, additional conductive lines can be formed in the second interlayer dielectric layer 120. The conductive lines are electrically connected to either at least one active contact AC or at least one gate electrode GE through the vias VI.

According to embodiments of the present inventive concept, sizes of cell regions can be reduced while enhancing electrical characteristics of field effect transistors in the cell regions. Accordingly, a semiconductor device of the present inventive concept is highly integrated and has excellent performance.

Although exemplary embodiments of the present inventive concept have been discussed with reference to accompanying figures, it will be understood that various changes in form and details may be made therein without departing from the spirit and scope of the present inventive concept. It therefore will be understood that the embodiments described above are just illustrative but not limitative in all aspects.

What is claimed is:

1. A semiconductor device comprising:
   a substrate that includes active patterns that extend in a second direction;
   a third device isolation layer disposed on an upper portion of the substrate, the third device isolation layer defining a PMOSFET region and an NMOSFET region in the substrate; and
   a gate electrode that extends across the active patterns in a first direction that crosses the second direction,
   wherein the active patterns extend across the PMOSFET region and the NMOSFET region, and
   wherein the third device isolation layer is disposed between the PMOSFET region and the NMOSFET region, the third device isolation layer comprising:
   a first part that extends in the second direction; and
   a second part that extends in a third direction that crosses the first and second directions, wherein the second part has opposite sidewalls parallel to the third direction, in a plan view.

2. The device of claim 1, wherein the first part has a first width in a direction perpendicular to the second direction, and the second part has a second width in a direction perpendicular to the third direction,
   wherein the first and second widths are substantially equal to each other.

3. The device of claim 1, wherein the third device isolation layer further comprises a third part that extends in the second direction, wherein
   the second part is interposed between the first and third parts, and
   the number of the active patterns of the PMOSFET region adjacent to the first part differs from the number of the active patterns of the PMOSFET region adjacent to the third part.

4. The device of claim 1, further comprising first device isolation layers disposed on the upper portion of the substrate that extend in the second direction,
   wherein the first device isolation layers define the active patterns, and
   wherein a depth of the third device isolation layer is greater than a depth of the first isolation layers.

5. The device of claim 4, further comprising a second device isolation layer disposed on the upper portion of the substrate that separates the active patterns from each other in the second direction,
   wherein the second device isolation layer extends in the first direction, and
   wherein the depth of the third device isolation layer is greater than a depth of the second isolation layers.

6. The device of claim 5, wherein
   the second device isolation layer penetrates upper portions of the first device isolation layers, and
   the depths of the first device isolation layers are greater than the depth of the second isolation layer.

7. The device of claim 4, wherein an upper portion of each of the active patterns has a fin shape that protrudes between the first isolation layers.

8. The device of claim 1, wherein the active patterns comprises a first active pattern adjacent to the second part of the third device isolation layer,
   wherein the first active pattern has a first sidewall parallel to the third direction, in a plan view, the first sidewall of the first active pattern being vertically aligned with one of the opposite sidewalls of the second part.

9. The device of claim 8, further comprising:
   first device isolation layers that covers a second sidewall and a third sidewall of the first active pattern; and
   a second device isolation layer that covers a fourth sidewall of the first active pattern, the fourth sidewall being opposite to the first sidewall,
   wherein the second and third sidewalls of the first active pattern are parallel to the second direction, in a plan view, wherein the fourth sidewall of the first active pattern is parallel to the first direction, in a plan view, and wherein the first to third device isolation layers each have different depths.

10. The device of claim 1, wherein an upper portion of each of the active patterns comprises:

a pair of source/drain regions on opposite sides of the gate electrode; and a channel region between the source/drain regions.

11. A semiconductor device comprising:

a substrate that includes an active pattern that extends in a second direction; and first device isolation layers and a third device isolation layer disposed on an upper portion of the substrate, wherein the active pattern comprises first to fourth sidewalls, the second sidewall is opposite to the first sidewall, and the fourth sidewall is opposite to the third sidewall, the first device isolation layers cover the first and second sidewalls of the active pattern, the third device isolation layer covers the third sidewall of the active pattern, the first and second sidewalls are parallel to the second direction, in a plan view, the fourth sidewall is parallel to a first direction that crosses the second direction, in a plan view, the third sidewall is parallel to a third direction that crosses the first and second directions, in a plan view, and the third device isolation is deeper than the first device isolation layers.

12. The device of claim 11, wherein an upper portion of the active pattern has a fin shape that protrudes between the third device isolation layer and the first device isolation layers.

13. The device of claim 11, further comprising a second device isolation layer that covers the fourth sidewall of the active pattern, wherein the first device isolation layers are deeper than the second device isolation layer.

14. The device of claim 11, wherein the substrate comprises a PMOSFET region and an NMOSFET region defined by the third device isolation layer, the active pattern comprises a first active pattern on the PMOSFET region and a second active pattern on the NMOSFET region, the third device isolation layer comprises a first part that extends in the third direction, the third sidewall of the first active pattern is aligned with one of opposite sidewalls of the first part, and the third sidewall of the second active pattern is aligned with the other of opposite sidewalls of the first part.

15. The device of claim 11, wherein the third device isolation layer comprises a second part that extends in the third direction, a first part that extends in the second direction, and a third part that extends in the second direction, wherein the second part is interposed between the first and third parts, and the second part covers the third sidewall of the active pattern.

16. A semiconductor device comprising:

a substrate that includes active patterns that extend in a second direction;

first device isolation layers disposed on an upper portion of the substrate that extend in the second direction, wherein the first device isolation layers define the active patterns;

a second device isolation layer disposed on the upper portion of the substrate that separates the active patterns from each other in the second direction, wherein the second device isolation layer extends in a first direction that crosses the second direction; and a third device isolation layer disposed on the upper portion of the substrate, wherein the third device isolation layer comprises:

a first part that extends in the second direction;

a second part that extends in a third direction that crosses the first and second directions, wherein the second part has opposite sidewalls parallel to the third direction, in a plan view, and a third part that extends in the second direction, wherein the second part is interposed between the first and third parts.

17. The semiconductor device of claim 16, wherein:

the third device isolation layer defines a PMOSFET region and an NMOSFET region in the substrate, the active patterns extend across the PMOSFET region and the NMOSFET region, the third device isolation layer is disposed between the PMOSFET region and the NMOSFET region, and the number of the active patterns of the PMOSFET region adjacent to the first part differs from the number of the active patterns of the PMOSFET region adjacent to the third part.

18. The semiconductor device of claim 16, wherein the second device isolation layer penetrates upper portions of the first device isolation layers, an upper portion of each of the active patterns has a fin shape that protrudes between the first device isolation layers, a depth of the third device isolation layer is greater than a depth of the first device isolation layers, and the depth of the third device isolation layer is greater than a depth of the second device isolation layers.

19. The semiconductor device of claim 16, wherein the active pattern comprises first to fourth sidewalls, the second sidewall is opposite to the first sidewall, and the fourth sidewall is opposite to the third sidewall, the first device isolation layers cover the first and second sidewalls of the active pattern, the third device isolation layer covers the third sidewall of the active pattern, the first and second sidewalls are parallel to the second direction, in a plan view, the fourth sidewall is parallel to the first direction, in a plan view, and the third sidewall is parallel to the third direction, in a plan view.

20. The semiconductor device of claim 16, wherein the first part has a first width in a direction perpendicular to the second direction, the second part has a second width in a direction perpendicular to the third direction, and the third part has a third width in a direction perpendicular to the second direction wherein the first, second and third widths are substantially equal to each other.

* * * * *